United States Patent [19]

Fogal

[11] Patent Number: 5,196,809
[45] Date of Patent: Mar. 23, 1993

[54] HIGH GAIN, LOW DISTORTION, FASTER SWITCHING TRANSISTOR

[76] Inventor: William J. Fogal, 4222 Wheeler Rd., Martinez, Ga. 30907

[21] Appl. No.: 663,011

[22] Filed: Mar. 1, 1991

[51] Int. Cl.$^5$ ............................................. H03F 3/191
[52] U.S. Cl. ................................... 330/307; 330/303; 257/678
[58] Field of Search ............... 330/294, 296, 302, 303, 330/306, 307; 357/74; 381/120, 121

[56] References Cited

U.S. PATENT DOCUMENTS

| | | | |
|---|---|---|---|
| 2,949,533 | 8/1960 | Read | 250/20 |
| 2,984,743 | 5/1961 | Scott | 250/20 |
| 3,060,329 | 10/1962 | Harrison et al. | 307/88.5 |
| 3,210,680 | 10/1965 | Farris | 330/26 |
| 3,254,303 | 5/1966 | Brewer et al. | 330/296 X |
| 3,383,609 | 5/1968 | Wheatley, Jr. | 330/15 |
| 3,440,543 | 4/1969 | Polzl | 324/404 |
| 3,535,647 | 10/1970 | Kozawa et al. | 330/18 |
| 3,551,834 | 12/1970 | Yamazaki et al. | 330/29 |
| 3,560,768 | 2/1971 | Rimkus | 307/264 |
| 4,028,634 | 6/1977 | Tentarelli | 330/151 |
| 4,143,331 | 3/1979 | Page | 330/2 |
| 4,278,901 | 7/1981 | Kishi | 307/350 |
| 4,297,645 | 10/1981 | Tanaka et al. | 330/280 |
| 4,331,930 | 5/1982 | Shibata et al. | 330/267 |
| 4,713,628 | 12/1987 | Nelson | 330/254 |

OTHER PUBLICATIONS

"Filter", Van Nostrand Scientific Encyclopedia, Fifth Edition, published by Van Nostrand Reinhold Company, New York, New York, 1976, pp. 1036 and 1037.
Basic Electronics Technology, by Alvis J. Evans, et al, published by Radio Shack, Forth Worth, Texas, 1985, pp. 53 and 54.

Primary Examiner—Steven Mottola
Attorney, Agent, or Firm—Nies, Kurz, Bergert & Tamburro

[57] ABSTRACT

A transistor in which the emitter terminal is coupled to ground through a filter capacitor. The filter capacitor has a capacitance of from about 0.2 $\mu f$ to about 22 $\mu f$ and can be connected either by itself or in parallel with a resistor, depending upon the circuit in which it is used. The incorporation of a filter capacitor of such a capacitance level provides greatly improved gain and less distortion of the input signal, to permit a high output to be achieved in fewer amplifier stages and with less current draw and heating than in conventional transistor amplifier stage circuits. Additionally, the transistor can be provided in a unitary structure by incorporating the filter capacitor directly on the transistor chip, and can also be provided by incorporating the transistor and a resistor within the casing of a filter capacitor.

9 Claims, 4 Drawing Sheets

HIGH GAIN, LOW DISTORTION, FASTER SWITCHING TRANSISTOR

BACKGROUND OF THE INVENTION

1. FIELD OF THE INVENTION

The present invention relates to a new form of transistor that provides improved performance of transistor and IC chip circuits using transistors, such as for amplifier stages for audio amplifiers. More particularly, the present invention relates to a transistor that is adapted to receive a low level input signal and to substantially increase the signal gain in a single stage without significant signal distortion, and with less signal loss, less heat buildup, faster switching times, and a tolerance to higher level input signals without shutdown, as compared with existing devices.

2. DESCRIPTION OF THE RELATED ART

Transistors have been in use for some time in a multitude of types of electrical apparatus. They have been employed to switch circuits, to amplify voltage outputs, to amplify varying AC input signals, and to amplify inputs having varying frequencies, among other uses. Typically, transistors are semiconductor devices that have emitter-base-collector sections of either NPN or PNP configurations.

Audio amplifiers employing transistors and other circuit elements have been in use for some time for amplifying low level audio input signals to provide an amplified audio output signal of high fidelity for driving a loudspeaker. Typically, such amplifiers have a number of separate, but interconnected, stages to sequentially amplify and increase the magnitude of the incoming signal to a level sufficient to drive a suitable mechanical output device, such as a loudspeaker or a headphone.

In order to avoid excessive distortion of the incoming and amplified signal throughout the course of its passage through the several stages of the amplifier, complex circuitry has been required, involving a number of discrete circuit elements in order to properly condition the signal within and between the several amplifier stages to furnish the desired output signal level to provide the desired level and quality of sound output. Frequently, a resistor is positioned between the emitter and ground to reduce signal distortion. Further, it is known to also position a ceramic or other non-filter capacitor in parallel with the resistor. However, the capacitors that are used for that purpose are of relatively low capacitance, often of the level of around 0.01 $\mu f$.

Additionally, the heat generated by existing transistor circuits often requires the addition of heat sinks to devices in which such circuits are used, in order for the transistors to function properly.

Examples of circuits that have been developed to provide a desired level and quality of output signal include those disclosed in U.S. Pat. No. 4,143,331, which issued Mar. 6, 1979, to Ronald W. Page; U.S. Pat. No. 3,210,680, which issued Oct. 5, 1965, to Paul D. Farris; and U.S. Pat. No. 4,028,634, which issued Jun. 7, 1977, to Kenneth Donald Tentarelli. In each of those patents there are disclosed circuits incorporating a plurality of interconnected transistors, some of which are NPN transistors that have their emitter junctions connected to ground through a capacitor or through a capacitor-resistor network.

It is an object of the present invention to provide a transistor that provides a comparable output in a unitary amplification stage that is normally achieved in multiple stages.

It is another object of the present invention to provide a transistor that operates at higher output levels without generating excessive heat.

It is a further object of the present invention to provide a transistor that results in faster switching and that is capable of receiving higher peaks of input signal without transistor shutdown and with less distortion than presently available transistors.

It is still a further object of the present invention to provide an improved transistor amplifier stage that provides a substantially greater gain than has heretofore been obtained in conventional transistor amplifier stages.

It is another object of the present invention to provide an improved transistor amplifier stage that incorporates fewer components than existing transistor amplifier stages.

It is still another object of the present invention to provide an improved transistor that provides a higher level of gain without distorting the output signal.

SUMMARY OF THE INVENTION

Briefly stated, in accordance with one aspect of the present invention, a transistor is provided that includes a standard transistor to which is added a filter capacitor of predetermined capacitance level in parallel with a resistance element to provide a ground connection.

In accordance with another aspect of the present invention, a transistor amplifier input stage circuit is provided for use in a multi-stage audio amplifier. The circuit includes input and output means, a transistor having the base coupled with the input means to receive an input signal, and the collector coupled with the output means to provide an output signal. The transistor emitter is coupled with an emitter output circuit, wherein the emitter output circuit includes a polarized or non-polarized electrolytic filter capacitor coupled between the emitter and ground in order to pass an AC signal through the transistor to the collector to increase the magnitude of the output signal.

In accordance with still another aspect of the present invention, the transistor is a NPN transistor and the filter capacitor has a capacity of from about 0.2 $\mu f$ to about 22 $\mu f$, with some specific applications using a capacitor having a capacitance of up to 47 $\mu f$.

DESCRIPTION OF THE PREFERRED EMBODIMENTS

Figure 1:
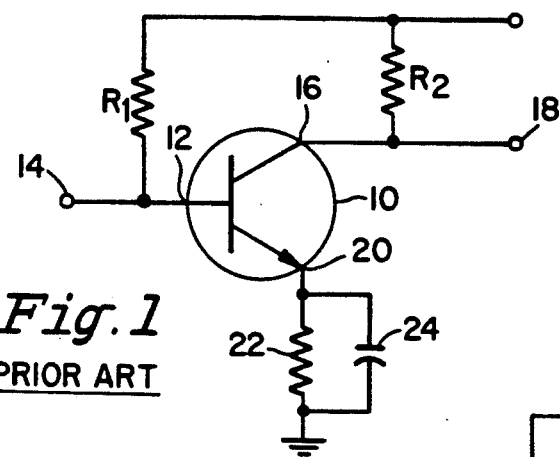
FIG. 1 is a schematic view of a common prior art transistor amplifier stage incorporating an NPN transistor.

Referring now to the drawings, and particularly to FIG. 1 thereof, there is shown a transistor amplifier stage incorporating an NPN transistor 10 having a base terminal 12 coupled with an input 14 and having a collector terminal 16 junction coupled with an output terminal 18. The emitter terminal is connected to ground through a resistor 22 and a conventional capacitor 24 connected in parallel. Typically, capacitor 24 is of low capacitance, and is most often a non-polarized capacitor of the ceramic type. It is also common for such a transistor amplifier stage to be provided without the capacitor. Although shown as an NPN-type transistor, a PNP-type transistor can also be used.

In normal practice, a number of individual amplifier stages of the type shown in FIG. 1 are suitably interconnected to provide several stages of amplification in order to amplify a low level input signal to provide an output signal having the desired output level. In the circuit shown in FIG. 1 resistor 22 is provided to prevent input voltage peaks from distorting the signal. Capacitor 24 is provided to reduce leakage through the emitter resistor while the transistor is on, or to reduce signal going to ground while the transistor is switching. Capacitor 24 is always a ceramic or non-filter capacitor of significantly lower capacitance than that of the present invention, because a non-filter capacitor of similar rating would shut the transistor down, or it would be too large in size. Similarly, an even greater capacity filter capacitor would shut the transistor down, or it would provide no additional benefit in performance.

Figure 2:
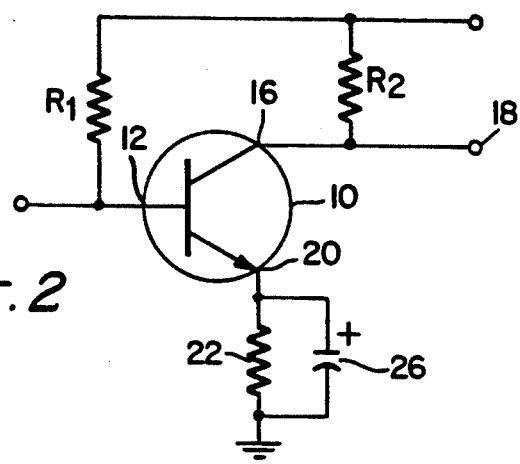
FIG. 2 is a schematic view similar to FIG. 1, but showing a transistor amplifier stage circuit in accordance with the present invention, including a filter capacitor.

In the present invention, on the other hand, which is shown illustratively in FIG. 2, the same basic transistor as is shown in FIG. 1 includes, instead of a common capacitor 24, a filter capacitor 26, which thereby replaces the conventional capacitor in the circuit shown in FIG. 1. Filter capacitor 26 can be polarized, but is most often used in non-polarized form. The resistor value is selected based upon the transistor and filter capacitor ratings.

Instead of bypassing the AC signal to ground as does non-polarized capacitor 24 in the FIG. 1 arrangement, filter capacitor 26 instead discharges the AC signal back through transistor 10 to collector terminal 16. The result is a substantial increase in the gain of the transistor, along with a corresponding increase in the conduction voltage at emitter terminal 20, as well as at collector terminal 16, as shown in the following Table I. Consequently, the amplifier stage shown in FIG. 2 draws very little current as shown in Table II, which compares the outputs of each of the circuits shown in FIGS. 1 and 2.

TABLE I

|  | FIG. 1 | FIG. 2 |
| --- | --- | --- |
| BIAS | 0.63 V | 0.63 V |
| CONDUCTION | 2.28 V | 2.46 V |
| EMITTER CAP | 0.01 μf Ceramic | 22 μf Filter |
| INPUT | 0.126 mV @ 1 KHz | 0.126 mV @ 1 KHz |
| OUTPUT | 0.195 mV | 1.062 mV |

In addition to providing substantially increased gain in a single stage, thereby requiring fewer such stages to provide a signal having the desired output level, a transistor amplifier stage in accordance with the present invention avoids the need to provide complex feedback circuits that would otherwise be required to minimize output distortion resulting from saturation of the transistor when too high a signal is applied to the base terminal. In that regard, the substitution of a polarized filter capacitor for the conventional non-polarized capacitor has led to the surprising and unexpected result of substantially higher gain in a single stage.

The circuit in accordance with the present invention, as shown in FIG. 2, is preferably used as a pre-driver, a driver, or a pre-amplifier stage in an amplifier circuit. Although the exact mechanism by which the present circuit provides such surprising and unexpected results is not fully understood, it is theorized that possibly the connection of a filter capacitor with the emitter terminal causes the conduction of the emitter terminal to regulate itself in accordance with the input signal provided at the base terminal of the transistor. This emitter terminal regulation is believed to cause the transistor to conduct for a longer period of time, and the transistor does not become saturated. As a result, the output signal is at a very high gain and is a clean signal because the conduction of the transistor occurs over a longer time period, and it therefore passes more signal. In actual tests an increase in the dynamic range of the output signal has been noted, and there is therefore no need for an equalizer in the circuit because the signal is not clipped or distorted, and there is reduced frequency loss. Further, because the transistor stage functions more efficiently, it is not necessary to provide a large heat sink for the transistor.

The capacitance of the filter capacitor used in the circuit in accordance with the present invention is dependent upon the input signal level. Typically, however, the capacitance ranges from about 0.2 μf to about 22 μf. In that regard, because a filter capacitor takes less time to charge than does a conventional capacitor, if the capacitance value is too small there is no significant change in the output. On the other hand, too high a capacitance value results in the transistor taking a long time to charge, and can possibly shut down the transistor. Furthermore, the filter capacitor contemplated to obtain the benefits of the present invention need not be provided as a single capacitor having a capacitance of between 0.2 μf to 22 μf, but other capacitor ratings, or circuit arrangements with multiple filter capacitors of the same or different capacitor ratings can be used, depending upon the requirements of the desired application. For example, a 10 μf filter capacitor and a 100 μf filter capacitor can be connected in parallel with each other and also in parallel with a resistor, and that parallel circuit combination of capacitors and resistor can be connected between the transistor emitter and ground. In that regard, the resistor value is selected based upon the transistor rating and also based upon the ratings of the filter capacitors.

Although shown in FIG. 2 as part of a capacitor-resistor network, the emitter output circuit can be provided in the form only of a filter capacitor, if desired, the precise arrangement of the emitter output circuit being dependent upon the design of the remainder of the circuit in which it is used. Further, because of the high gain that the present invention provides, the amplifier stage in accordance with the present invention, incorporating a filter capacitor, is preferably provided at the input or driver stage of an amplifier, rather than at the output stage, or in a feedback loop.

Figure 3:
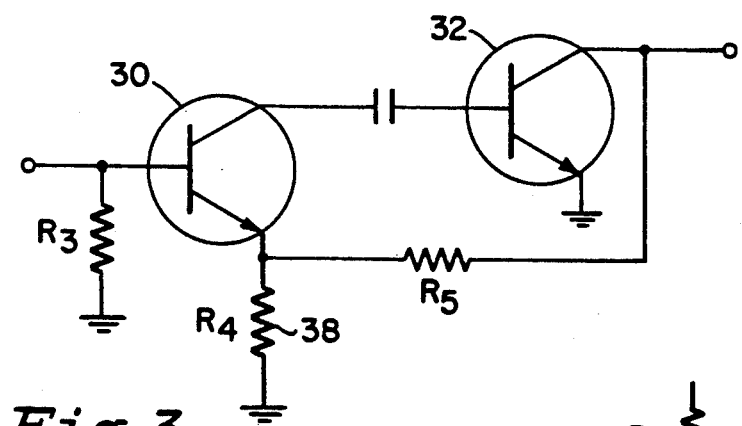
FIG. 3 is a schematic view of two stages of a prior art capacitor-coupled amplifier.

Referring now to FIG. 3, there is shown a conventional capacitor-coupled amplifier having two NpN transistors 30, 32 connected in series in conventional form to provide a two-stage amplifier. Emitter terminals 34, 36 are each connected to ground, terminal 36 directly and terminal 34 through a resistor 38 ($R_4$).

Figure 4:
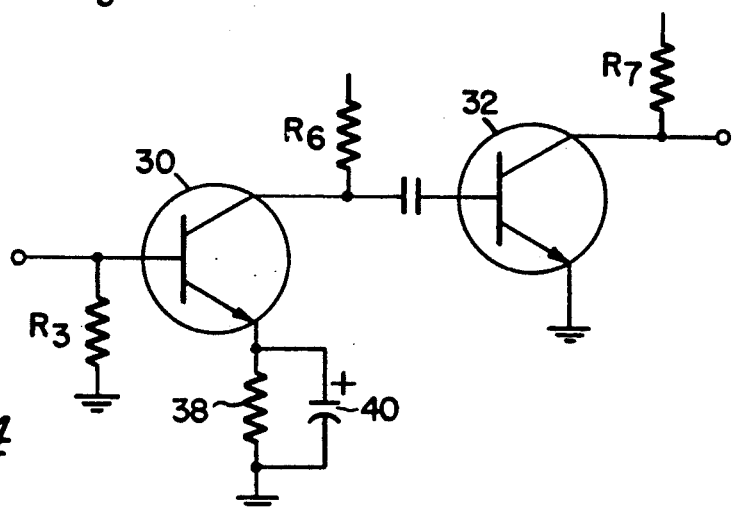
FIG. 4 is a schematic view similar to FIG. 3 showing a capacitor-coupled amplifier including a transistor and filter capacitor in accordance with the present invention.

The circuit shown in FIG. 3, as modified by incorporating a filter capacitor in accordance with the present invention, is illustrated in FIG. 4. As there shown, the addition in the input stage of a 22 µf filter capacitor provides a degree of improvement in output signal level that permits the elimination of additional amplifier stages beyond the two shown. For the same input signal, the circuit illustrated in FIG. 4 provides a gain of about four times an much as the circuit illustrated in FIG. 3 because of a significant loss of gain in the FIG. 3 circuit resulting from the bleeding off to ground of the AC signal. The FIG. 4 circuit will readily handle sharp peaks of input signal without damaging the transistors, and the transistors run cooler because the circuit draws less current. As a result, the FIG. 4 circuit provides higher gain and more clarity with fewer parts and longer life because the transistor functions differently as a result of the polarized filter capacitor discharging through the transistor collector instead of to ground.

Instead of limiting signal loss, as does the common capacitor 24 in FIG. 1, filter capacitor 26 of FIG. 2 causes the basic transistor to function differently, and to thereby provide significantly improved results. In the present invention, as compared to traditional transistors, the combination of a filter capacitor with the transistor provides a significantly higher output signal for the same input signal. Weaker input signals can be amplified by the present transistor circuit to almost the same output signal levels as are higher level input signals in a conventional transistor circuit. The output signal from the present transistor circuit remains undistorted, even at much higher input signal levels, the emitter voltage remains lower, and the transistor continues to switch or stay on at much higher input signal levels and collector current values than a conventional transistor is rated to handle.

Examples of the changes in transistor performance characteristics that accrue as a result of the use of the present invention are illustrated in the following Tables II through VI for the traditional transistor listed below and for the circuit conditions set forth. Additionally, reference hereinbelow to the FIG. 1 transistor should be understood to means the conventional transistor shown in FIG. 1 without a filter capacitor, and reference to the FIG. 2 transistor should be understood to mean a transistor in accordance with the present invention that includes a filter capacitor having a capacitance of from about 0.2 µf to about 22 µf.

| STANDARD TRANSISTOR AND CIRCUIT DATA |
| --- |
| Transistor MPS2222A NPN (no capacitor) |
| IC 800 mA (Collector current rating) |
| B+ 3.15 Volts |
| Bias 0.606 Volts |
| Frequency 1 KHz |
| All measurements versus B+ |

TABLE II

INPUT SIGNAL 0.100 VAC

|  | Standard Transistor | FIG. 1 | FIG. 2 |
| --- | --- | --- | --- |
| Capacitor µf | None | 0.01 (Ceramic) | 22.0 (Filter) |
| Input Signal VAC | 0.100 | 0.100 | 0.100 |
| Output Signal VAC | 0.325 | 0.325 | 1.208 |
| Signal distortion | None | None | None |
| Base Current DC | 2.293 A | 2.293 A | 2.293 A |
| Emitter Current DC | 2.914 A | 2.914 A | 2.914 A |
| Collector Current DC | 0.592 mA | 0.596 mA | 0.466 mA |
| Emitter Volts DC | 0.540 V | 0.540 V | 0.390 V |
| Collector Volts DC | 1.11 V | 1.11 V | 1.82 V |

TABLE III

INPUT SIGNAL 0.140 VAC

|  | Standard Transistor | FIG. 1 | FIG. 2 |
| --- | --- | --- | --- |
| Capacitor µf | None | 0.01 (Ceramic) | 22.0 (Filter) |
| Input Signal VAC | 0.140 | 0.140 | 0.140 |
| Output Signal VAC | 0.457 | 0.457 | 1.220 |
| Signal distortion | None | None | None |
| Base Current DC | 2.293 A | 2.293 A | 2.293 A |
| Emitter Current DC | 2.914 A | 2.914 A | 2.914 A |
| Collector Current DC | 0.597 mA | 0.600 mA | 0.736 mA |
| Emitter Volts DC | 0.433 V | 0.434 V | 0.336 V |
| Collector Volts DC | 1.557 V | 1.552 V | 2.112 V |

TABLE IV

INPUT SIGNAL 0.500 VAC

|  | Standard Transistor | FIG. 1 | FIG. 2 |
| --- | --- | --- | --- |
| Capacitor µf | None | 0.01 (Ceramic) | 22.0 (Filter) |
| Input Signal VAC | 0.500 | 0.500 | 0.500 |
| Output Signal VAC | 1.014 | 1.015 | 1.022 |
| Signal distortion | TOTAL | TOTAL | NONE |
| Base Current DC | 2.293 A | 2.293 A | 2.293 A |
| Emitter Current DC | 2.914 A | 2.914 A | 2.914 A |
| Collector Current DC | 0.610 mA | 0.610 mA | 0.726 mA |
| Emitter Volts DC | 0.353 V | 0.353 V | 0.336 V |
| Collector Volts DC | 1.995 V | 1.990 V | 2.266 V |

TABLE V

Figure 5:
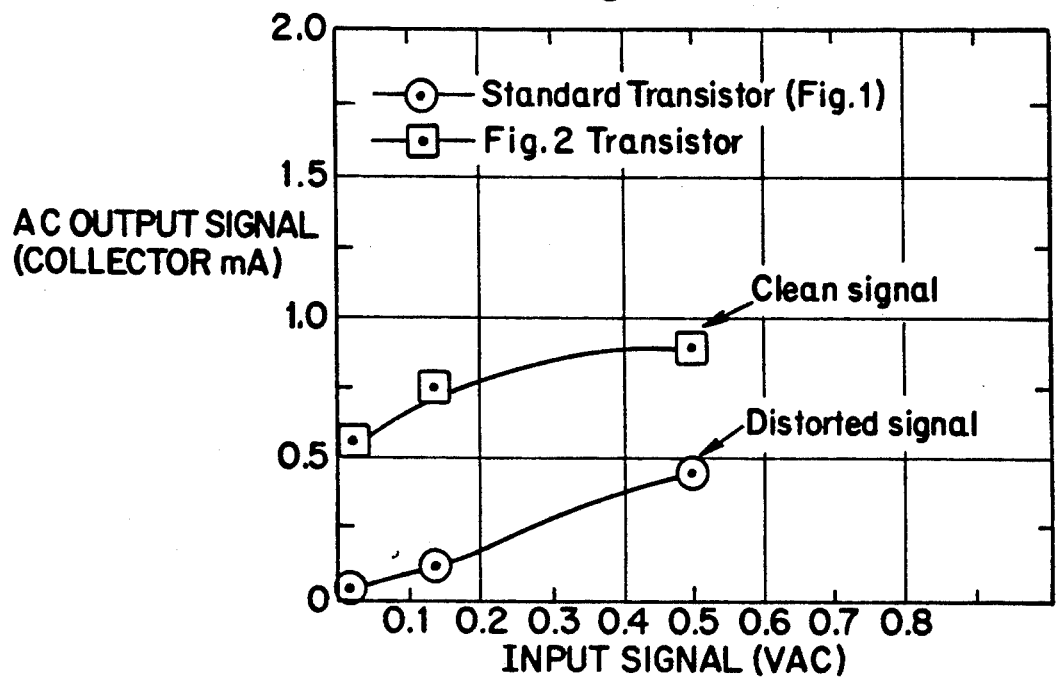
FIGS. 5 through 9 are graphs comparing several performance parameters of conventional transistors with transistors in accordance with the present invention

AC Current (mA) (See FIG. 5)

| Input Signal VAC | Emitter | | Base | | Collector | |
| --- | --- | --- | --- | --- | --- | --- |
|  | No. Cap. | 22 µf | No. Cap. | 22 µf | No. Cap. | 22 µf |
| 0.028 | 0.117 | 0.117 | 0.050 | 0.044 | 0.029 | 0.563 |
| 0.140 | 0.116 | 0.116 | 0.146 | 0.048 | 0.138 | 0.779 |
| 0.500 | 0.118 | 0.118 | 0.438 | 0.097 | 0.451 | 0.901 |

An input of 0.028 volts is about the minimum signal required to operate this transistor. Note that the transistor as shown in FIG. 2 amplifies even the weakest input signal (base current and input voltage) to almost maximum signal amplification. Equally important, the FIG. 2 transistor uses significantly less power (base current) to run the transistor. As a result the FIG. 2 transistor runs so much cooler, while producing significantly higher amplification.

TABLE VI

| | INPUT SIGNAL 3.0 VAC | | |
|---|---|---|---|
| | Standard Transistor | FIG. 1 | FIG. 2 |
| Capacitor μf | None | 0.01 (Ceramic) | 22.0 (Filter) |
| Input Signal VAC | 3.0 | 3.0 | 3.0 |
| Output Signal VAC | NONE | NONE | NONE |
| Collector Rating DC | 0.800 A | 0.800 A | 0.800 A |
| Collector Current DC | 0.971 A | 0.974 A | 2.220 A |
| Transistor State | Shutdown | Shutdown | Operating |

At the 3.0 volt input signal level the FIG. 2 transistor handled significantly more collector current, even when overdriven, without shutting down the transistor.

The performance differences between a standard transistor, with or without a non-filter capacitor, and a transistor in accordance with the present invention with a filter capacitor, as presented in Tables II through VI above, are shown in the graphs provided in FIGS. 5 through 9. Note that throughout those graphs the standard transistor and FIG. 1 transistor (data points identified by circles) have virtually the same operating characteristics, while the FIG. 2 transistor (data points identified by squares) has significantly improved characteristics in comparison.

FIG. 5 illustrates that the FIG. 2 transistor provides about five times the AC output current upon application of input signals just large enough to activate the transistor, in comparison with the FIG. 1 or standard transistor. The AC current output remains higher for the FIG. 2 transistor than for the FIG. 1 transistor as the input signal level is increased, up to the point the FIG. 1 transistor output signal is distorted, while the FIG. 2 transistor output signal remains clean. Furthermore, the FIG. 2 transistor was activated at an input signal level of 0.014 AC and provided 0.667 collector VAC output, while the FIG. 1 transistor would not activate at this low input signal level. In fact, activation of the FIG. 2 transistor did not occur until the input signal level was about 0.028 VAC. This demonstrates that the FIG. 2 transistor switches faster than a FIG. 1 transistor, because it is activated by a lower voltage or current level, while at the same time providing a higher output signal than the FIG. 1 transistor for the same level of input signal.

Figure 6:
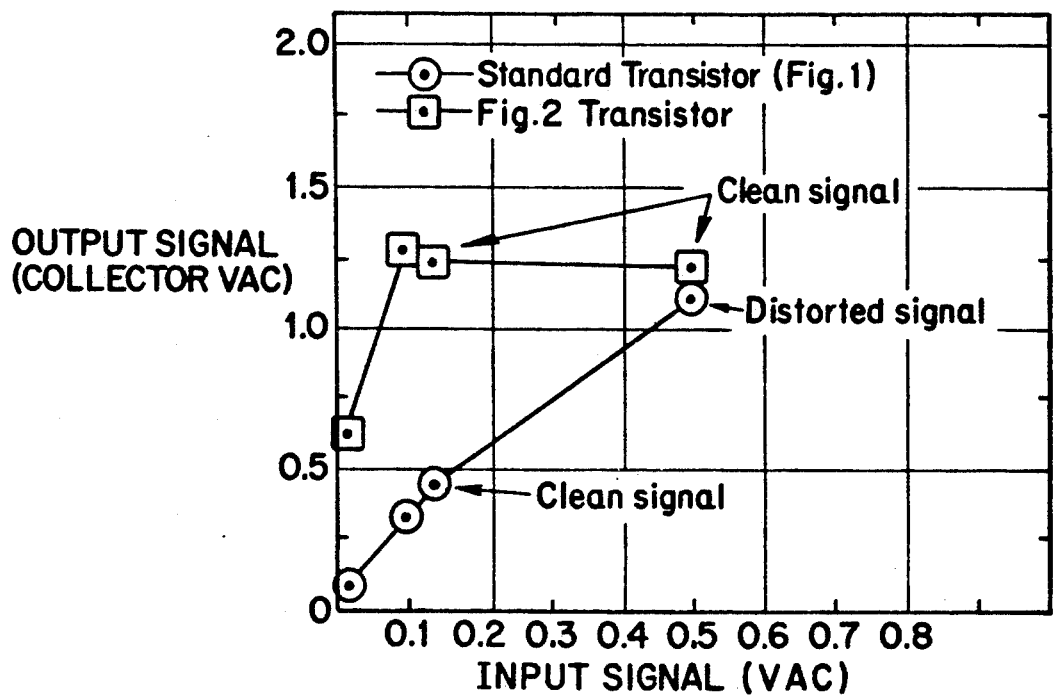

FIG. 6 illustrates that the FIG. 2 transistor has about 4 times the output voltage amplification as the standard transistor for a low AC input signal. The FIG. 2 transistor output voltage amplification decreases slightly as the AC input signal increases, but the signal remains undistorted, while the FIG. 1 transistor requires enough input signal to distort its output signal before it reaches the same amplification.

Figure 7:
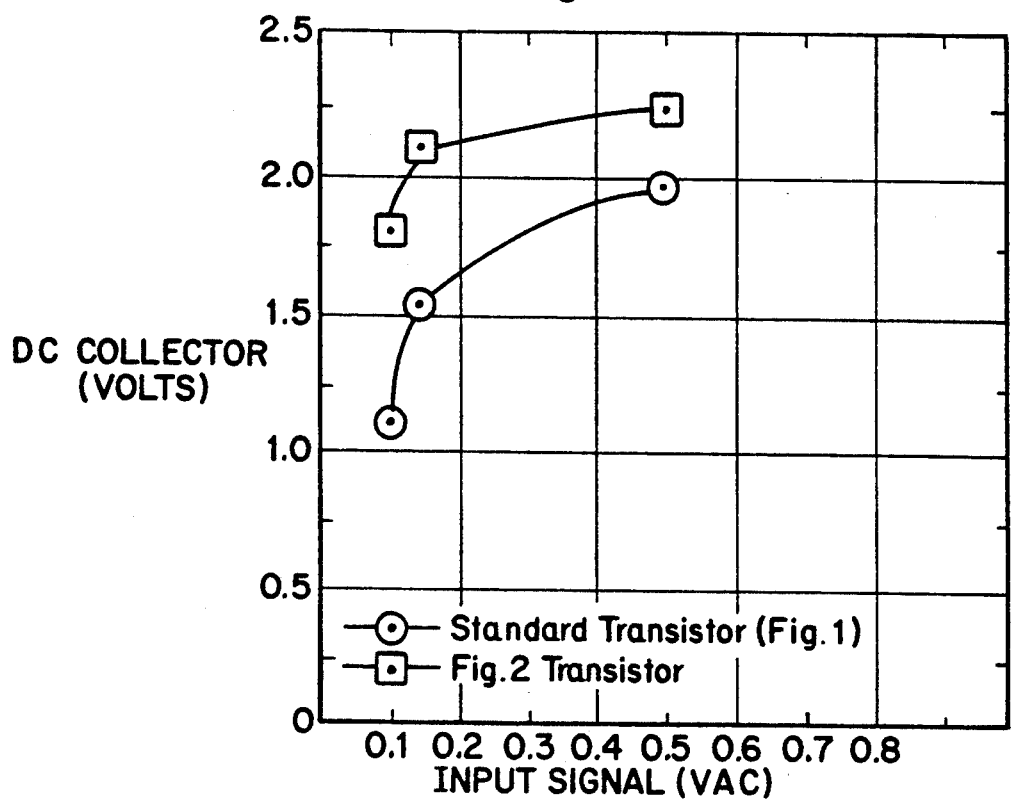
Figure 8:
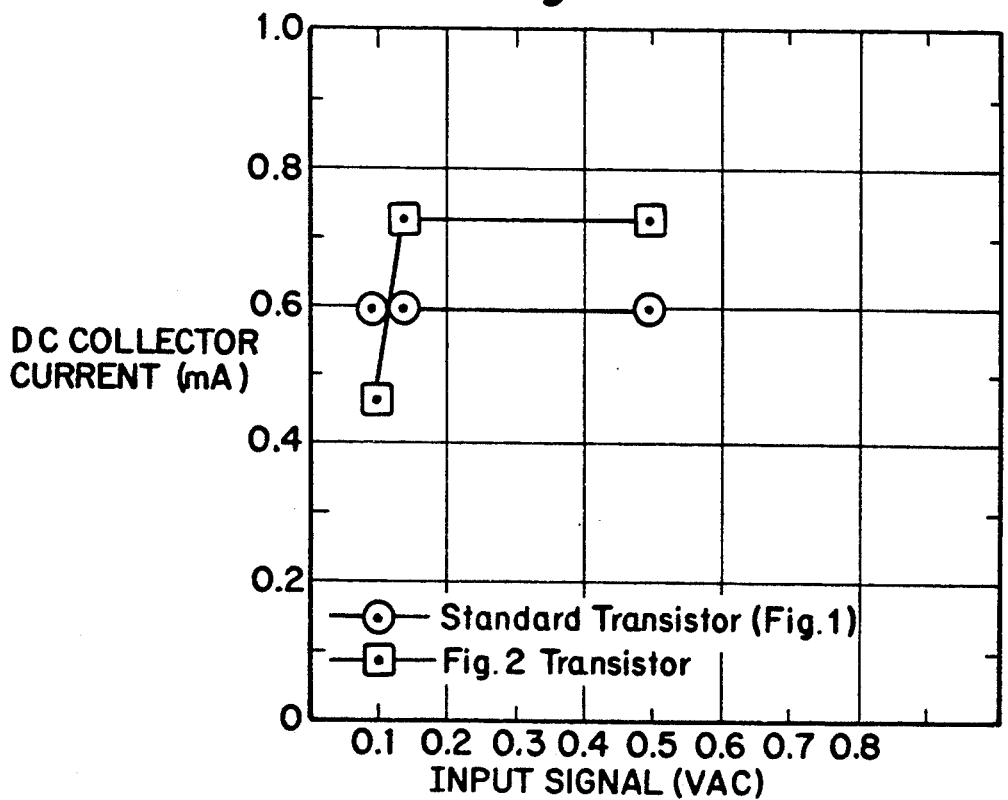

FIGS. 7 and 8 collectively illustrate that the FIG. 2 transistor provides a higher DC collector voltage for a lower AC input signal voltage, as compared with the FIG. 1 transistor. The FIG. 2 transistor also requires less power (DC collector current) to establish a higher DC collector voltage. This indicates the FIG. 2 transistor is switching faster for lower and higher input signals and using less power (DC collector current) to switch at lower input signal strengths.

Figure 9:
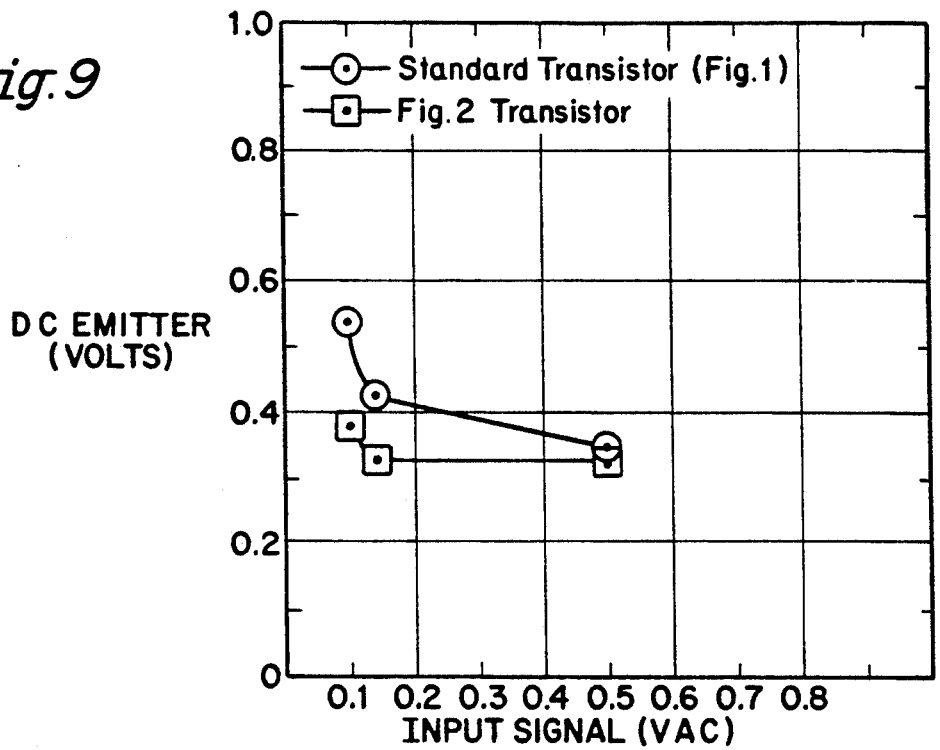

FIGS. 7, 8, and 9 collectively illustrate that the FIG. 2 transistor provides a higher DC collector voltage level at lower input signal levels, because it bleeds off less DC voltage through the emitter to ground than does the FIG. 1 transistor. FIGS. 7, 8, and 9 further illustrate that at a very low input signal level the FIG. 2 transistor rapidly reaches its lowest DC emitter voltage level and its highest DC collector current level, and that both values remain virtually constant thereafter, virtually independent of the input signal level. On the other hand, the FIG. 1 transistor requires virtually the same DC collector current at all input signal strengths to produce an increasing DC collector voltage, with a corresponding DC emitter voltage decrease for an increase in input signal level.

Note from Table III above that the FIG. 1 transistor increasingly distorts the signal for higher DC collector voltage and current, while the FIG. 2 transistor does not. This suggests that the FIG. 2 transistor uses DC collector voltage and current derived from lower emitter voltage and current bleedoff to switch the transistor faster without distorting the signal.

Collectively, the example data in the graphs and tables presented herein illustrate that the FIG. 2 transistor handles a significantly wider range of DC current and voltage, as well as a wider range of AC input signal levels and peaks, without distorting the output signal, while the FIG. 1 transistor does distort the signal. Thus the FIG. 2 transistor is self-regulating whereas the FIG. 1 transistor is not.

The foregoing discussion describes just one application of the FIG. 2 transistor design as an amplifier. The same semi-conductor improved characteristics with a filter capacitor controlled emitter apply to other common circuit applications. The FIG. 2 design works equally well in circuits using the basic transistor theory or components to fabricate gates, flipflops, single shots, triggers, rectifiers, and diodes where amplification, switching, turn ons, shut offs, and the like, are desired.

A practical model of one actual application of a FIG. 2 transistor was constructed by replacing a FIG. 1 transistor with a FIG. 2 transistor as a driver transistor in an audio preamplifier, using a switch to selectively shift from the FIG. 1 transistor to the FIG. 2 transistor. Switching the circuit to the FIG. 2 transistor produced an immediate threefold volume gain, an audibly significant increase in tone clarity, and the previously hot preamplifier circuit operated cool to the touch. The circuit could then be overdriven with a high input signal (versus the radio and transistor ratings) without output distortion or transistor shutdown. Consequently, use of the present invention in a circuit requires fewer components to achieve higher output with less heat generation, and therefore less need for providing heat sinking. Because the FIG. 2 transistor is more stable and self-regulating, fewer (if any) feedback or coupling components are required to join FIG. 2 transistors in series to increase net amplification without distortion, loss of signal phase (eliminating or reducing the need for equalizer circuits), or to protect the transistor from input signal surges.

The precise reasons for the improved performance of the FIG. 2 transistor are not fully understood at this time. However, it is believed that the addition of a filter capacitor of a specific higher capacitance level, when coupled with the emitter as hereinabove described, produces a DC and AC magnetic field that induces enhanced electron flow to the collector. In addition, it is believed the filter capacitor charges and discharges at a significantly higher voltage and exponentially faster than a non-filter capacitor or non-filter capacitor of a value that does not impede the transistor function.

Capacitors react inversely to both frequency changes and average current time, and higher frequencies have shorter wavelengths (time) and lower frequencies have longer wavelengths. Therefore, it is believed that a filter-capacitor-controlled emitter provides three additional benefits simultaneously:

First, the signal frequencies modulate both the capacitor (and therefore in a FIG. 2 transistor, the emitter) current and charge. It is believed that the only current that is changing is the AC signal input level, and the filter capacitor is charging and discharging with the AC switching in amounts that are frequency modulated. This is believed to provide instantaneous reverse bias to the base-emitter junction that switches with the AC signal current. Therefore, transistor switching time is significantly faster.

Second, the emitter capacitor does not discharge fully during AC switching because of the constant DC current and voltage. Therefore, it is believed that the emitter filter capacitor provides both a reversing net charge to the base, and discharges its frequency modulated AC charge to the collector while the AC signal is reversed. This is believed to keep the signal in phase and to maintain the conduction through the collector during switching.

Third, it is believed that the emitter-capacitor magnetic field induces additional electron flow and signal amplification to the collector. Unlike field effect transistors (FET and MOSFET), which create a capacitor around the transistor base and force electron travel only on the surface, the FIG. 2 transistor is believed to induce a higher electron flow through the thicker substrate, and therefore provide greater signal amplification. This makes the FIG. 2 transistor more thermally stable, like the MOSFET, and allows it to be either a voltage or current amplifier, without sacrificing amplification magnitude. In addition it is believed that the FIG. 2 transistor switches faster than the MOSFET because it provides bias in step with the AC switching as the emitter-capacitor charges and discharges AC voltage and current at the instant the AC signal switches polarity. In other words, the FIG. 2 transistor is believed to act as if it were already pre-biased at the emitter-base junction in the direction to which the AC signal switches.

The improved operating characteristics of the FIG. 2 transistor are further enhanced by fabricating it with the filter capacitor as an integral part of the transistor chip itself, as opposed to filter capacitor being externally connected with the transistor. That enhancement further supports the theory of a magnetic field effect, because the proximity of the field is brought closer to the emitter-base junction.

Figure 10:
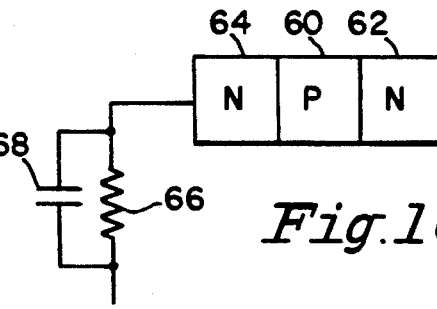
FIG. 10 is a schematic view of a transistor in accordance with the present invention.

FIG. 10 shows a schematic view of a basic FIG. 2 transistor, which includes a base 60 made from P-type semiconductor material, a collector 62 made from N-type semiconductor material, and an emitter 64 made from N-type semiconductor material. Additionally, coupled with emitter 64 is a network including a resistor 66 and a filter capacitor 68, which can be and preferably is an electrolytic capacitor. Resistor 66 and filter capacitor 68 are connected in parallel as shown.

Figure 11:
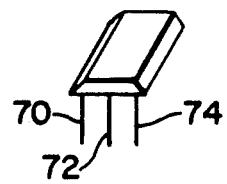
FIG. 11 is a perspective view of one form of transistor in accordance with the present invention provided in a unitary structure.

FIG. 11 shows a completed single chip incorporating the circuit elements shown in FIG. 10, and includes emitter terminal 70, base terminal 72, and collector terminal 74.

Figure 12:
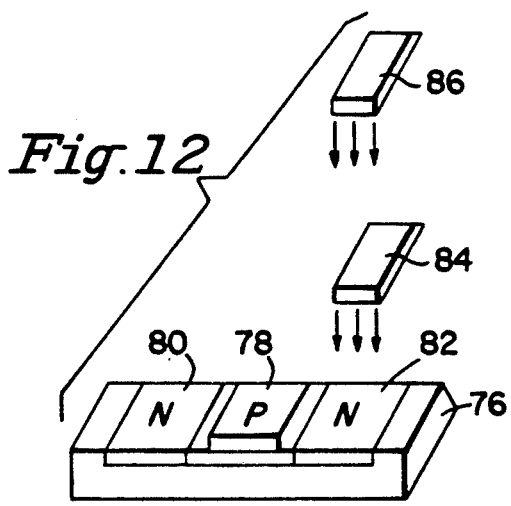
FIG. 12 is an exploded view showing the several elements of a transistor in accordance with the present invention.

FIG. 12 shows one structural arrangement in which the emitter-coupled filter capacitor is incorporated in a chip structure. A silicon chip 76 includes a P-type silicon base element 78, an N-type silicon collector element 80, and an N-type silicon emitter element 82, each positioned on the surface of chip 76. A carbon resistor 84 is positioned on the surface of emitter 82, and an electrolytic capacitor 86 is positioned on the surface of resistor 84. The elements of the chip structure shown in FIG. 11 are interconnected in the manner illustrated in the sohematic view of FIG. 10.

Figure 13:
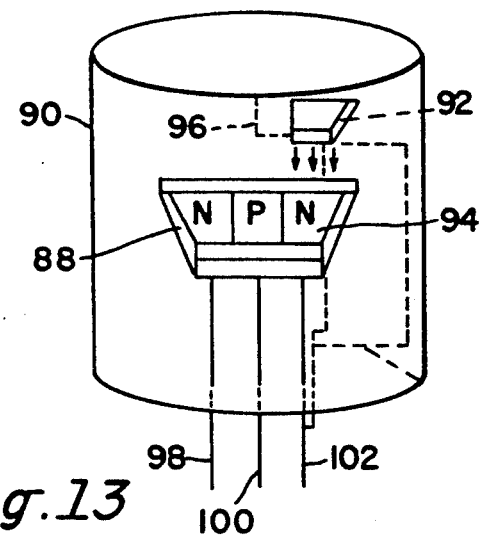
FIG. 13 is a perspective view of another form of transistor in accordance with the present invention wherein the transistor and resistor are positioned and housed within a filter capacitor.

FIG. 13 shows another transistor structure in accordance with the present invention in which the NPN-type transistor 88 is housed within the casing 90 of a filter capacitor. Resistor 92 is positioned on emitter 94, as in the FIG. 12 embodiment, and is coupled with the filter capacitor by a lead 96. Filter capacitor casing 90 includes output lead 98 from the collector of transistor 88, output lead 100 from the base of transistor 88, and output lead 102 from the emitter of transistor 88, the latter being coupled with the filter capacitor and with resistor 92 in accordance with the schematic diagram of FIG. 10. It should be understood that the precise physical structure of the transistor of the present invention can vary based on the desired end application and performance criteria.

Although shown in FIGS. 2, 4, and 10 through 12 as an NPN-type transistor, that showing is merely illustrative, and the basic transistor can also be an PNP-type, if desired.

The incorporation of the circuit elements of the FIG. 2 transistor into a single chip provides a circuit device similar in structure to a Darlington amplifier, in which two transistors are mounted in a single housing.

Although particular embodiments of the present invention have been illustrated and described, it will be apparent to those skilled in the art that various changes and modifications can be made without departing from the spirit of the present invention. It is therefore intended to encompass within the appended claims all such changes and modifications that fall within the scope of the present invention.

What is claimed is:

1. An integrated circuit comprising:
   a) a substrate;
   b) one of an NPN and a PNP transistor integrally formed on the substrate, the transistor having a base, a collector, and an emitter;
   c) a parallel resistor and filter capacitor network coupled with the emitter and mounted on the transistor to form an integral part of the integrated circuit, the filter capacitor including an outer casing; and
   d) base, collector, and emitter terminals on the substrate and coupled with the base, the collector, and the emitter, respectively, to permit the integrated circuit to be connected with an electronic circuit, wherein the integrated circuit is contained within the filter capacitor outer casing.

2. An integrated circuit in accordance with claim 1 wherein the capacitor has a capacitance of from about 0.2 µf to about 22 µf.

3. An integrated circuit in accordance with claim 2 wherein the capacitor is an electrolytic capacitor.

4. A transistor comprising:
 a) a base made from one of a P-type and an N-type semiconductor material;
 b) a collector and an emitter made from the other of a P-type and N-type semiconductor material, the collector and emitter each contacting the base to provide respective collector-base and emitter-base junctions;
 c) a resistor carried gy the emitter and having first and second terminals, the first resistor terminal in contact with the emitter;
 d) a filter capacitor carried by the resistor and having first and second terminals, the first capacitor terminal in contact with the emitter; and
 e) a base terminal coupled with the base, a collector terminal coupled with the collector, and ane mitter terminal coupled with the second resistor terminal and with the second capacitor terminal, the respective base, collector, and emitter terminals adapted to connect the transistor with an electronic circuit.

5. A transistor in accordance with claim 4 wherein the filter capacitor has a capacitance of from about 0.2 $\mu$f to about 22 $\mu$f.

6. A transistor in accordance with claim 5 wherein the filter capacitor is an electrolytic capacitor.

7. A transistor in accordance with claim 4 wherein the resistor is positioned on the emitter.

8. A transistor in accordance with claim 7 wherein the filter capacitor is positioned on the resistor.

9. A transistor circuit element comprising:
 a) a casing, wherein the casing is the casing of a filter capacitor;
 b) one of an NPN and a PNP transistor housed within the casing, the transistor having a base, a collector, and an emitter;
 c) a parallel resistor and filter capacitor network coupled with the emitter and housed within the casing; and
 d) base, collector, and emitter terminals on the casing and coupled with the base, the collector, and the emitter, respectively, to permit the transistor circuit element to be connected with an electronic circuit.

* * * * *